(12) United States Patent
Hong et al.

(10) Patent No.: US 10,756,135 B2
(45) Date of Patent: Aug. 25, 2020

(54) DISPLAY DEVICE

(71) Applicant: LG ELECTRONICS INC., Seoul (KR)

(72) Inventors: Daewoon Hong, Seoul (KR); Sangtae Park, Seoul (KR); Myeongwook Bae, Seoul (KR); Jeongsik Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/140,133

(22) Filed: Sep. 24, 2018

(65) Prior Publication Data

US 2019/0096955 A1 Mar. 28, 2019

(30) Foreign Application Priority Data

Sep. 25, 2017 (KR) .......................... 10-2017-0123629

(51) Int. Cl.

| | |
|---|---|
| *H01L 27/14* | (2006.01) |
| *H01L 27/15* | (2006.01) |
| *G09F 9/33* | (2006.01) |
| *H01L 25/075* | (2006.01) |
| *H01L 33/54* | (2010.01) |
| *H01L 33/48* | (2010.01) |

(52) U.S. Cl.
CPC .............. *H01L 27/156* (2013.01); *G09F 9/33* (2013.01); *H01L 25/0753* (2013.01); *H01L 33/54* (2013.01); *H01L 33/486* (2013.01); *H01L 2933/0033* (2013.01)

(58) Field of Classification Search
CPC . H01L 27/156; H01L 525/0753; H01L 33/54; H01L 33/486
See application file for complete search history.

(56) References Cited

U.S. PATENT DOCUMENTS 7,576,496 B2 * 8/2009 Duggal .................... G09F 9/33
313/504
2007/0030703 A1 2/2007 Lee et al.
(Continued)

FOREIGN PATENT DOCUMENTS

| JP | 2006253164 | 9/2006 |
|---|---|---|
| KR | 100665375 | 1/2007 |
| WO | 2014011016 | 1/2014 |

OTHER PUBLICATIONS

PCT International Application No. PCT/KR2018/011326, International Search Report dated Jan. 17, 2019, 3 pages.

*Primary Examiner* — Phuc T Dang
(74) *Attorney, Agent, or Firm* — Lee, Hong, Degerman, Kang & Waimey

(57) ABSTRACT

A display device is disclosed. The display device includes a substrate having a front surface and a rear surface opposite the front surface, an electrode layer formed on the front surface, a light source provided on the front surface and connected to the electrode layer, a first resin layer attached to the front surface of the substrate, and including a through hole exposing at least a part of the electrode layer and the light source to outside, and a second resin positioned in the through hole and covering the part of the electrode layer exposed to the outside. A volume of the second resin is 30 to 70% of a difference between a volume of a space formed by the through hole and a volume of the light source.

15 Claims, 22 Drawing Sheets

(56) References Cited

U.S. PATENT DOCUMENTS

| | | | |
|---|---|---|---|
| 2009/0263938 A1* | 10/2009 | Ino | H01L 21/4846 438/124 |
| 2009/0278151 A1* | 11/2009 | Kim | H01L 33/507 257/98 |
| 2010/0193822 A1* | 8/2010 | Inobe | H01L 33/56 257/98 |
| 2010/0320482 A1* | 12/2010 | Tachibana | H05K 3/284 257/88 |
| 2011/0115076 A1* | 5/2011 | Yamasaki | H01L 23/3114 257/737 |
| 2012/0261699 A1* | 10/2012 | Ooyabu | H01L 33/505 257/98 |
| 2014/0284639 A1* | 9/2014 | Lin | H01L 33/62 257/98 |
| 2015/0263065 A1 | 9/2015 | Inoue et al. | |
| 2016/0064695 A1* | 3/2016 | Yoshihara | H01L 51/524 257/40 |
| 2017/0084678 A1* | 3/2017 | Kanda | H01L 29/45 |
| 2017/0301483 A1* | 10/2017 | Endoh | H01G 9/2022 |
| 2018/0076181 A1* | 3/2018 | Onuma | H01L 25/0753 |

* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2017-0123629, filed on Sep. 25, 2017, the contents of which are hereby incorporated by reference herein in its entirety.

BACKGROUND OF THE INVENTION

Field of the Invention

Embodiments of the invention relate to a display device.

Discussion of the Related Art

Digital signage is a communication tool that enables advertisers to use marketing, advertising, training, and to induce customer experiences. The digital signage is a digital imaging device that provides both typical broadcasting content as well as advertising content intended by the advertisers in public places such as airports, hotels, hospitals. Since the digital signage not only has a built-in processor and memory, but also can move freely and express various contents clearly, it can be used for a variety of purposes, such as promotional use, customer service, and information media in department stores, subways, bus stops, etc. In addition, not only advertising content is provided through the digital signage, but various contents can be provided.

The digital signage generally uses a plurality of LEDs. The LEDs have long life span and high luminous efficiency, so they are used instead of conventional fluorescent lamps and incandescent bulbs. In addition, since the LEDs are smaller than conventional light sources, they are more popular as illumination devices.

Technical Problem-PCT

One object of the present disclosure may be to provide a display device that does not expose an electrode layer, a metal pad, or a light source to outside.

Another object of the present disclosure may be to provide a display device that protects an electrode layer, a metal pad, or a light source by filling a resin layer in which a hole is formed with a liquid resin.

The third object of the present disclosure may be to provide a display device that fills a resin layer in which a hole is formed with a liquid resin and minimizes decrease in luminance.

The fourth object of the present disclosure may be to provide a display device that can be easily attached to an attached surface.

The fifth object of the present disclosure may be to provide a display device that can protect an electrode layer, a metal pad, or a light source from external impact.

Advantageous Effects-PCT

According to at least one of embodiments of the invention, an electrode layer, a metal pad, or a light source may not be exposed to outside.

According to at least one of embodiments of the invention, an electrode layer, a metal pad, or a light source can be protected by filling a resin layer in which a hole is formed with a liquid resin.

According to at least one of embodiments of the invention, it is possible to fill a resin layer in which a hole is formed with a liquid resin and minimize decrease in luminance.

According to at least one of embodiments of the invention, a display device can be easily attached to an attached surface.

According to at least one of embodiments of the invention, an electrode layer, a metal pad, or a light source can be protected from external impact.

Additional scope of applicability of the invention will become apparent from the following detailed description. However, since various changes and modifications within the spirit and scope of the invention can be understood by those skilled in the art, it should be understood that specific embodiments, such as the detailed description and the preferred embodiments of the invention, are given as examples.

SUMMARY OF THE INVENTION

In one aspect, there is provided a display device including a substrate having a front surface and a rear surface opposite the front surface, an electrode layer formed on the front surface, a light source provided on the front surface and connected to the electrode layer, a first resin layer attached to the front surface of the substrate, and including a through hole exposing at least a part of the electrode layer and the light source to outside, and a second resin positioned in the through hole and covering the part of the electrode layer exposed to the outside. A volume of the second resin may be 30 to 70% of a difference between a volume of a space formed by the through hole and a volume of the light source.

The volume of the second resin may be 40 to 60% of the difference between the volume of the space formed by the through hole and the volume of the light source.

The second resin may have a thermosetting property.

The second resin may include silicon.

The second resin may have light transmittance.

A height of the first resin layer from the substrate may be greater than a height of the second resin from the substrate.

The display device may further include a metal pad positioned between the electrode layer and the light source.

A height of the second resin from the substrate may be greater than a height of the metal pad from the substrate.

The second resin may cover the metal pad.

A height of the second resin from the substrate may be greater than a height of the light source from the substrate.

The second resin may cover the light source.

The display device may further include an adhesive layer formed on the rear surface of the substrate and a second substrate attached to the adhesive layer.

The second substrate may have light transmittance.

A thickness formed by the substrate, the adhesive layer, and the second substrate may be greater than a thickness of the first resin layer.

The second substrate may include a polyethylene terephthalate (PET) material.

A thickness of the substrate may be greater than a thickness of the first resin layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
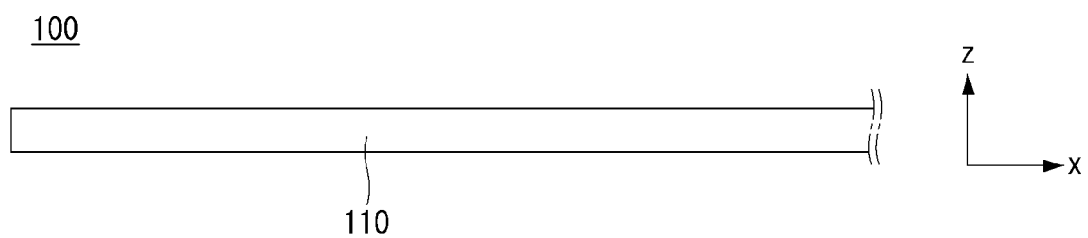
FIGS. 1 to 8 are views illustrating a display device according to an embodiment of the invention.

Reference will now be made in detail embodiments of the invention examples of which are illustrated in the accompanying drawings. Since the invention may be modified in various ways and may have various forms, specific embodiments are illustrated in the drawings and are described in detail in the present specification. However, it should be understood that the invention is not limited to specific disclosed embodiments, but include all modifications, equivalents and substitutes included within the spirit and technical scope of the invention.

The terms 'first', 'second', etc. may be used to describe various components, but the components are not limited by such terms. The terms are used only for the purpose of distinguishing one component from other components. For example, a first component may be designated as a second component without departing from the scope of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the invention are provided to those skilled in the art in order to describe the invention more completely. Accordingly, shapes and sizes of elements shown in the drawings may be exaggerated for clarity.

Referring to FIG. 1, a display device 100 may include a base 110. The base 110 may be referred to as a substrate. Alternatively, the base 110 may be referred to as a plate or a substrate. The base 110 may be made of a transparent material. Alternatively, the base 110 may have light transmittance. Thickness of the base 110 may be very thin. For example, the thickness of the base 110 may be 250 μm.

The base 110 may have insulating properties. Power supplied to the display device 100 may not be passed through the base 110 and may be blocked.

In the process of producing the display device 100, heat may be applied to the base 110. For example, the base 110 may include a polyethylene terephthalate (PET) material. When the thickness of the base 110 is sufficiently thick, it is possible to prevent the base 110 from being thermally deformed even if heat of 200 degrees or more is applied to the base 110 during the production process of the display device 100.

Figure 2:
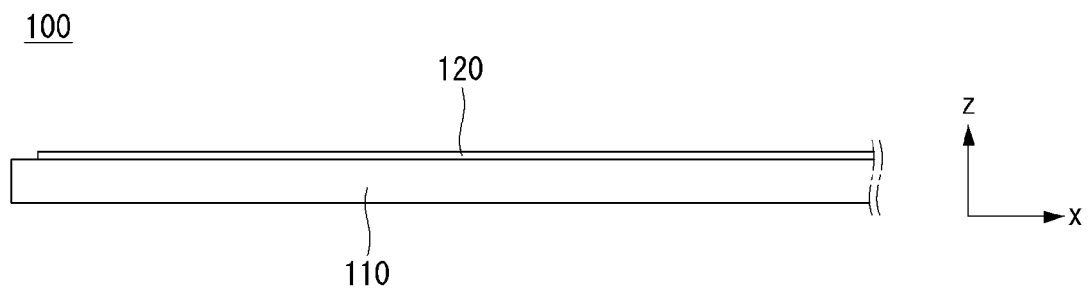

Referring to FIG. 2, an electrode layer 120 may be formed on the base 110. The electrode layer 120 may have conductivity. The electrode layer 120 may function as a passage for transmitting power supplied from a power source device. Further, the electrode layer 120 may function as a passage for transmitting a control signal transmitted from a control device.

The electrode layer 120 may be coated on the base 110. In addition, the electrode layer 120 may be coated on the base 110 with a very thin thickness. The electrode layer 120 may have light transmittance due to its thin thickness. Accordingly, even if the electrode layer 120 is coated on the base 110, the display device 100 may have light transmittance.

The electrode layer 120 may include metal nanowires. For example, the electrode layer 120 may include silver (Ag) nanowires. The silver nanowires may have high conductivity and may be excellent in light transmittance.

Figure 3:
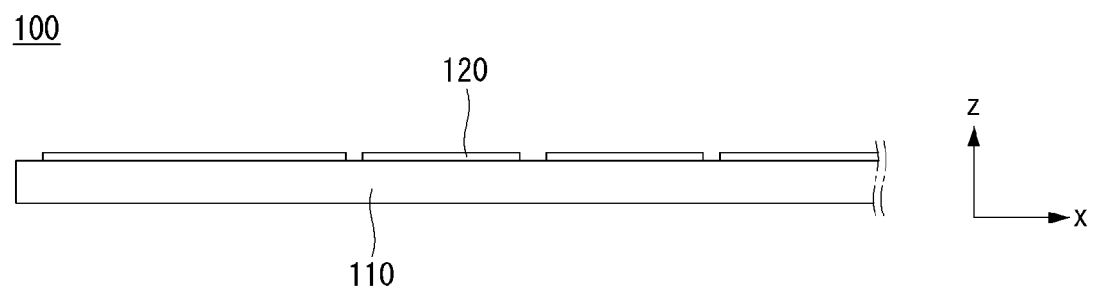

Referring to FIG. 3, the electrode layer 120 may form a pattern. The pattern of the electrode layer 120 can function as a wiring structure.

The pattern of the electrode layer 120 may be formed through an additional process after the electrode layer 120 is coated on the base 110. For example, the pattern of the electrode layer 120 may be formed by irradiating a laser beam onto the electrode layer 120 coated on the base 110. Alternatively, the pattern of the electrode layer 120 may be formed by etching the electrode layer 120 coated on the base 110.

Figure 4:
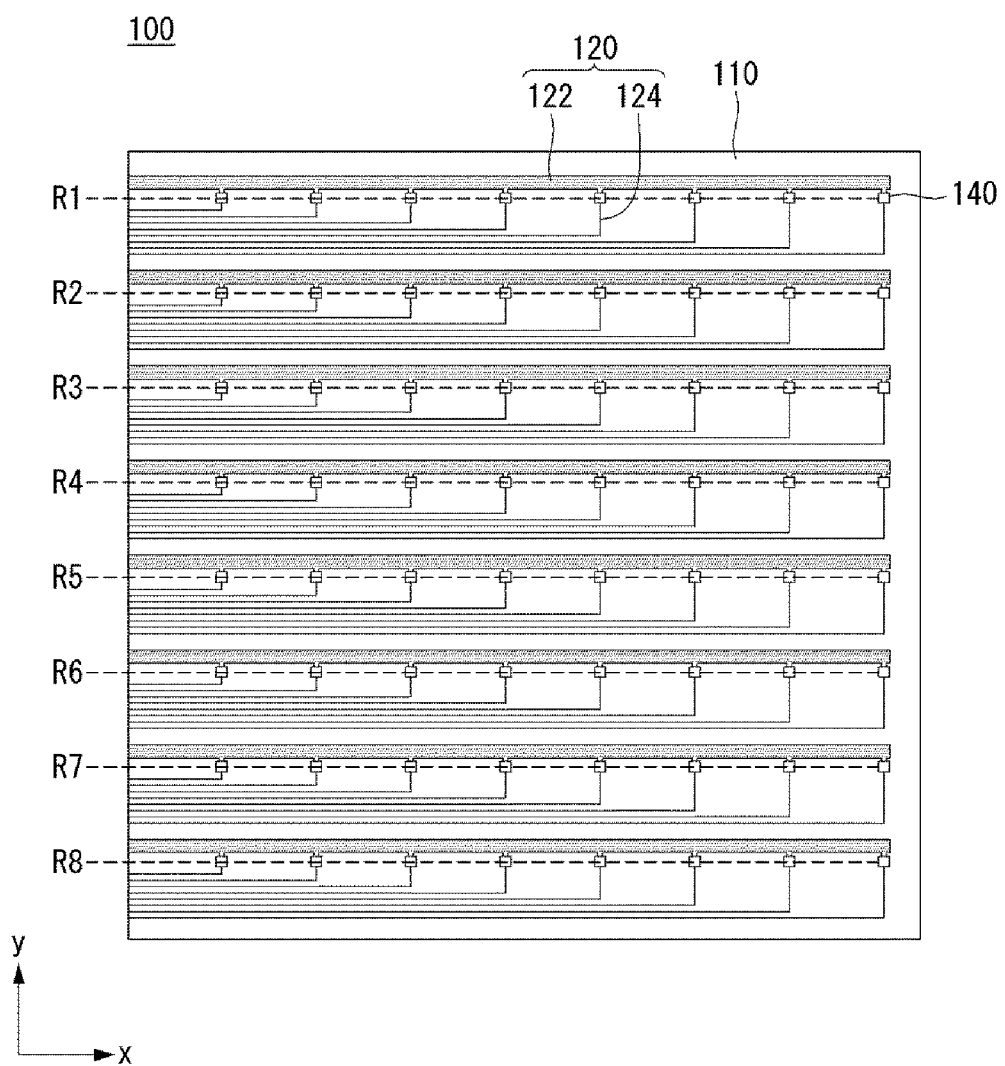

Referring to FIG. 4, the display device 100 may include a light source assembly 140. The light source assembly 140 may be provided on the base 110. In addition, the light source assembly 140 may be electrically connected to the electrode layer 120.

The electrode layer 120 may include a positive electrode 122 and a negative electrode 124. The positive electrode 122 may be referred to as an oxidation electrode, or an anode. The negative electrode 124 may be referred to as a reduction electrode, or a cathode.

The light source assembly 140 may be installed with a plurality of light source assemblies. The plurality of light source assemblies 140 may be arranged along one side of the base 110 and may form a row. The plurality of light source assemblies 140 forming one row may be spaced apart from each other. Alternatively, the plurality of light source assemblies 140 forming one row may be arranged at an equal distance.

A plurality of rows R1, R2, R3, R4, R5, and R6 formed by the plurality of light source assemblies 140 may be formed. Each of rows R1, R2, R3, R4, R5, and R6 may be arranged along one side of the base 110. Also, each of rows R1, R2, R3, R4, R5, and R6 may be spaced apart from each other. Alternatively, each of the rows R1, R2, R3, R4, R5, and R6 may be arranged at an equal distance from each other.

The positive electrode 122 may be extended along one row. The positive electrode 122 may be electrically connected to each of the plurality of light source assemblies 140 in one row. The positive electrode 122 may be positioned above one row.

The negative electrode 124 may be extended along one row. The negative electrode 124 may be electrically connected to each of the plurality of light source assemblies 140 in one row. The negative electrode 124 may be positioned below one row. That is, one row may be positioned between the positive electrode 122 and the negative electrode 124.

The positive electrode 122 connected to one row may be formed of one electrode. The plurality of light source assemblies 140 in one row may be connected to one positive electrode 122. A plurality of negative electrodes 124 connected to one row may be formed. The negative electrode 124 may be formed to correspond to each of the plurality of light source assemblies 140 in one row.

Figure 5:
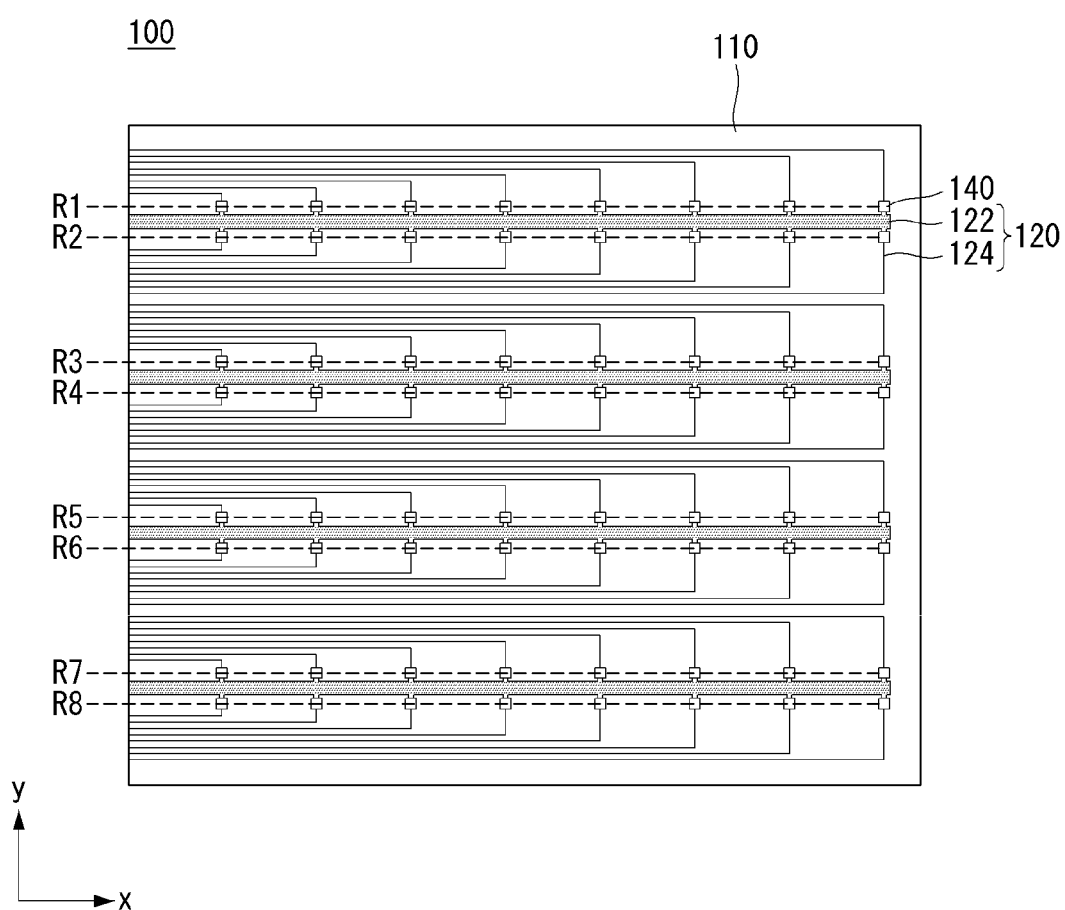

Referring to FIG. 5, a positive electrode 122 may be positioned between a first row R1 and a second row R2. Alternatively, the positive electrode 122 may be positioned between a third row R3 and a fourth row R4. Alternatively, the positive electrode 122 may be positioned between a fifth row R5 and a sixth row R6. Alternatively, the positive electrode 122 may be positioned between a seventh row R7 and an eighth row R8.

Each of a plurality of light source assemblies 140 in the first row R1 may be electrically connected to one positive electrode 122 positioned between the first row R1 and the second row R2. Each of a plurality of light source assemblies 140 in the second row R2 may be electrically connected to one positive electrode 122 positioned between the first row R1 and the second row R2.

A negative electrode 124 electrically connected to the first row R1 may be positioned above the first row R1. The negative electrode 124 may be formed to correspond to each of the plurality of light source assemblies 140 in the first row R1.

The negative electrode 124 electrically connected to the second row R2 may be positioned below the second row R2. The negative electrode 124 may be formed to correspond to each of the plurality of light source assemblies 140 in the second row R2.

A connection structure of the positive electrode 122 electrically connected to the third row R3, the negative electrode 124 electrically connected to the third row R3, the positive electrode 122 electrically connected to the fourth row R4, and the negative electrode 124 electrically connected to the fourth row R4 may be the same as the connection structure of the first row R1, the second row R2, the positive electrode 122, and the negative electrode 124 described above.

A connection structure of the fifth row R5 and the sixth row R6 and a connection structure of the seventh row R7 and the eighth row R8 may be also the same as the connection structure of the first row R1 and the second row R2.

Figure 6:
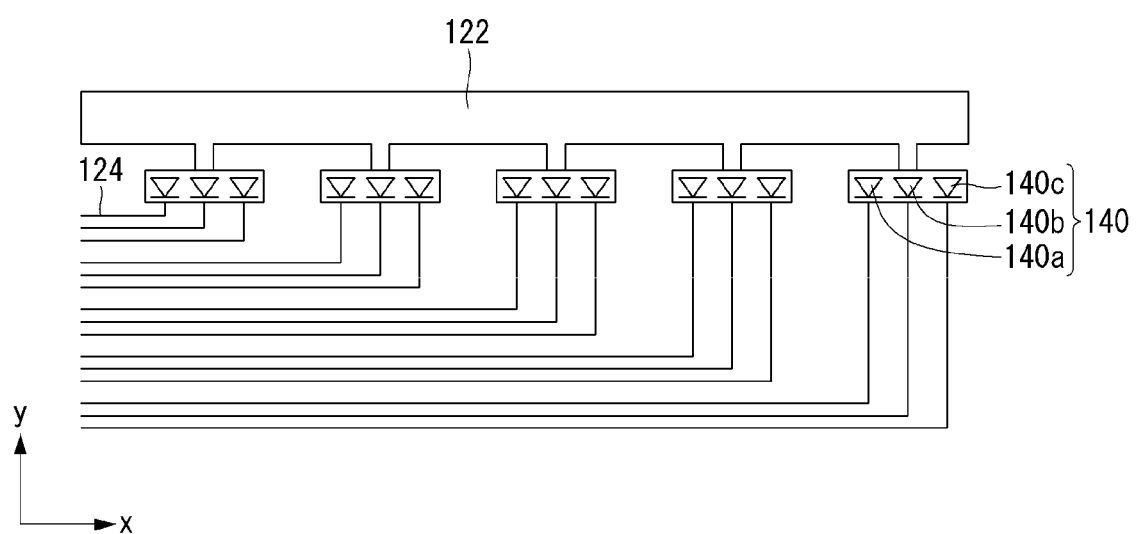

Referring to FIG. 6, a light source assembly 140 may include a plurality of LED chips 140a, 140b, and 140c. For example, the light source assembly 140 may include a red LED chip 140a, a green LED chip 140b, and a blue LED chip 140c.

A plurality of light source assemblies 140 may be electrically connected to one positive electrode 122, respectively. Negative electrodes 124 connected to the respective light source assemblies 140 may be independent of each other. Further, the negative electrodes 124 electrically connected to the respective light source assemblies 140 may include three electrodes. The three electrodes may be electrically connected to the red LED chip 140a, the green LED chip 140b, and the blue LED chip 140c, respectively. Thereby, the LED chips 140a, 140b, 140c of the light source assembly 140 can be individually controlled.

Figure 7:
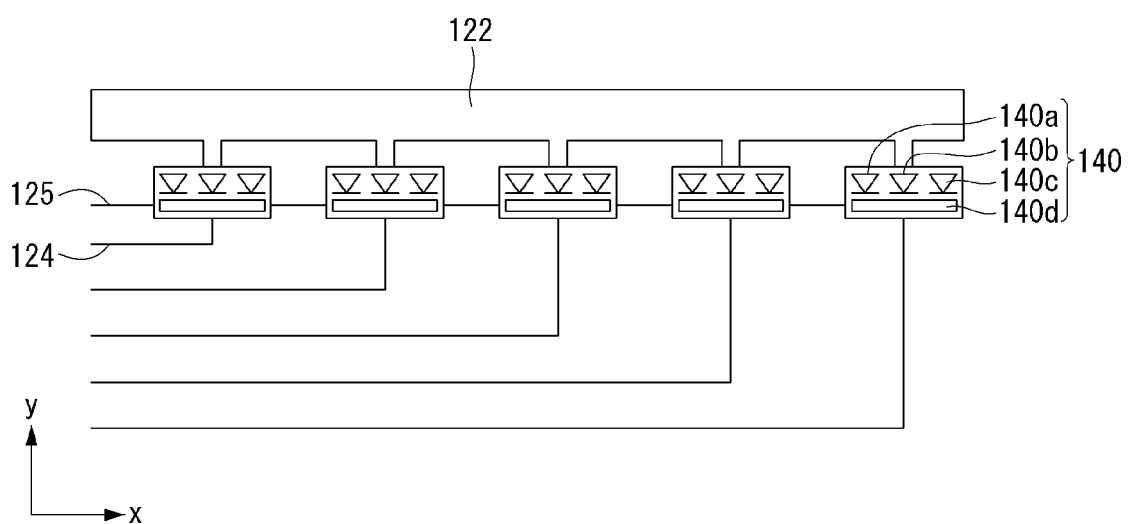
Figure 8:
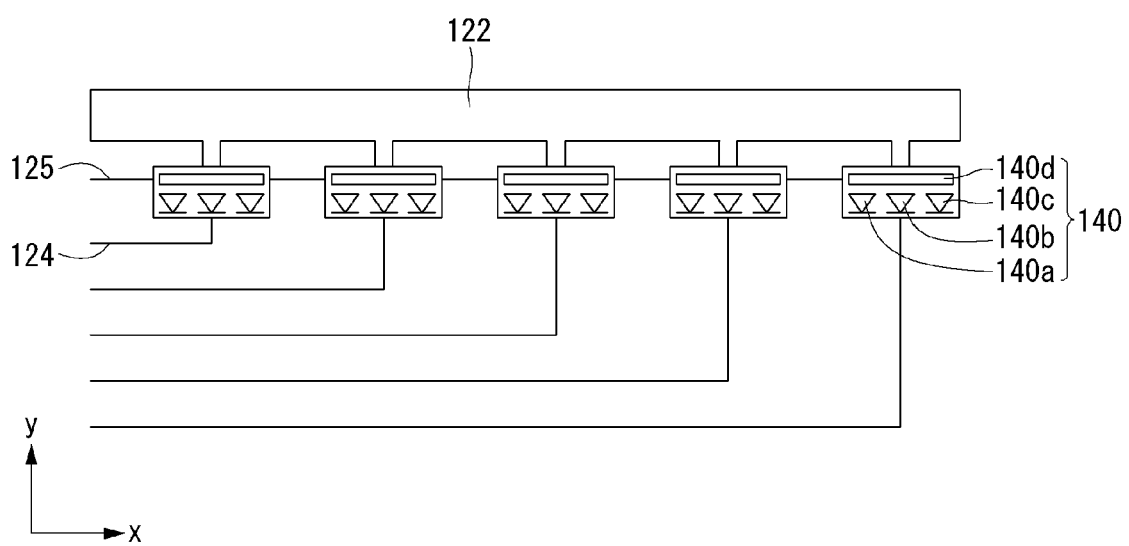

Referring to FIGS. 7 and 8, a light source assembly 140 may include a plurality of LED chips 140a, 140b, and 140c and an IC chip 140d. An electrode layer 120 may include a positive electrode 122, a negative electrode 124, and a control electrode 125. The positive electrode 122 may be referred to as an anode. Alternatively, the negative electrode 124 may be referred to as a cathode. Alternatively, the control electrode 125 may be referred to as an electrode. Alternatively, the control electrode 125 may be referred to as a switching electrode.

The control electrode 125 may electrically connect the light source assembly 140 to neighboring light source assemblies 140. In addition, the control electrode 125 may connect the neighboring light source assemblies 140 in series. The control electrode 125 may transmit a signal for controlling the IC chip 140d of the light source assembly 140.

A plurality of light source assemblies 140 may be electrically connected to one positive electrode 122, respectively. The negative electrodes 124 connected to the respective light source assemblies 140 may be independent of each other. In addition, the cathode electrode 124 electrically connected to the respective light source assemblies 140 may be one electrode. Even if the negative electrode 124 is not connected to each of the plurality of LED chips 140a, 140b, and 140c included in the light source assembly 140, the plurality of LED chips 140a, 140b and 140c can be individually controlled through the IC chip 140d.

A current supplied through a power supply device may flow in the order of the positive electrode 122, the plurality of LED chips 140a, 140b, 140c, the IC chip 140d, and the negative electrode 124. Alternatively, the current supplied through the power supply device may flow in the order of the positive electrode 122, the IC chip 140d, the plurality of LED chips 140a, 140b, 140c, and the negative electrode 124.

Figure 9:
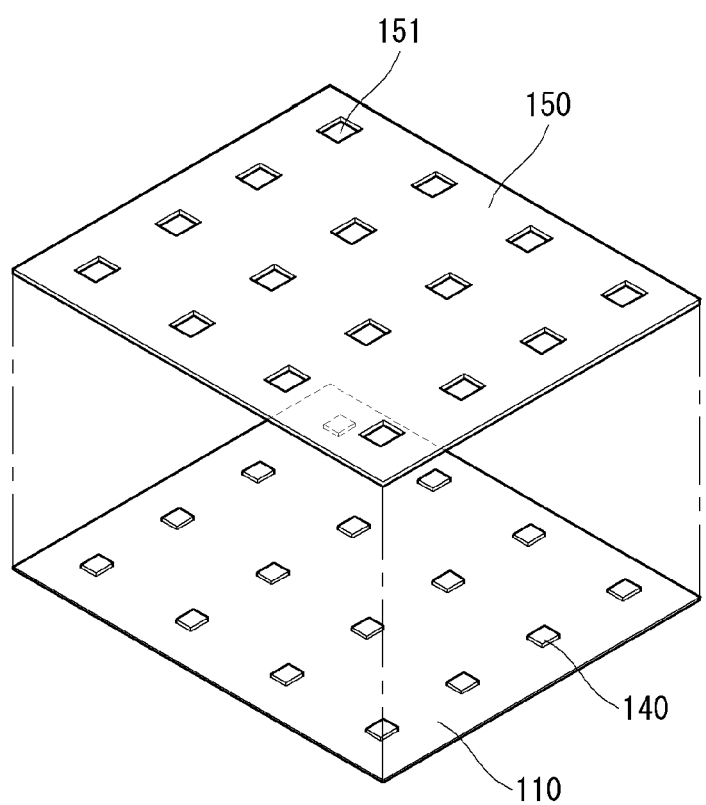
FIGS. 9 to 22 are views illustrating configuration of a display device according to an embodiment of the invention.

Referring to FIG. 9, a resin layer 150 may include a hole 151. The hole 151 may penetrate the resin layer 150. The resin layer 150 may be attached to a base 110. A light source 140 may be positioned in the hole 151. The holes 151 may be formed as many as the number of the light sources 140.

Figure 10:
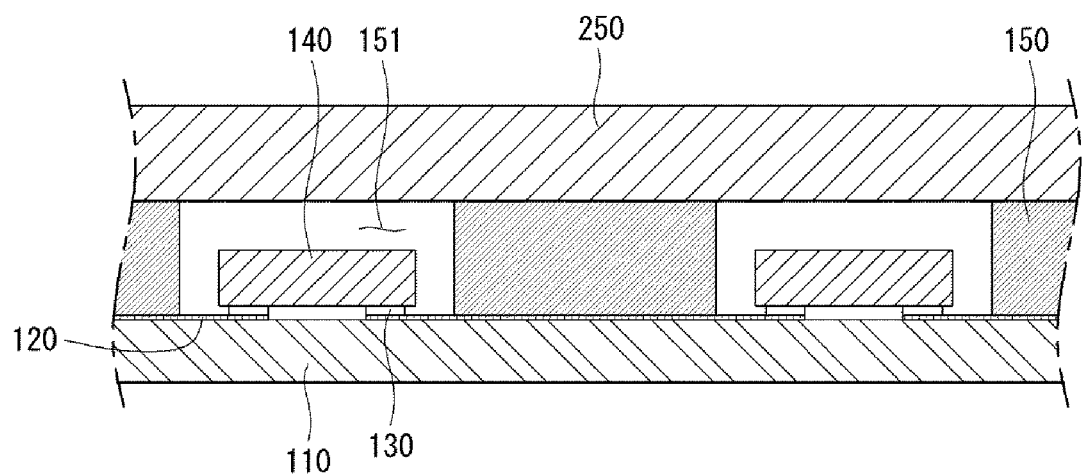
Figure 11:
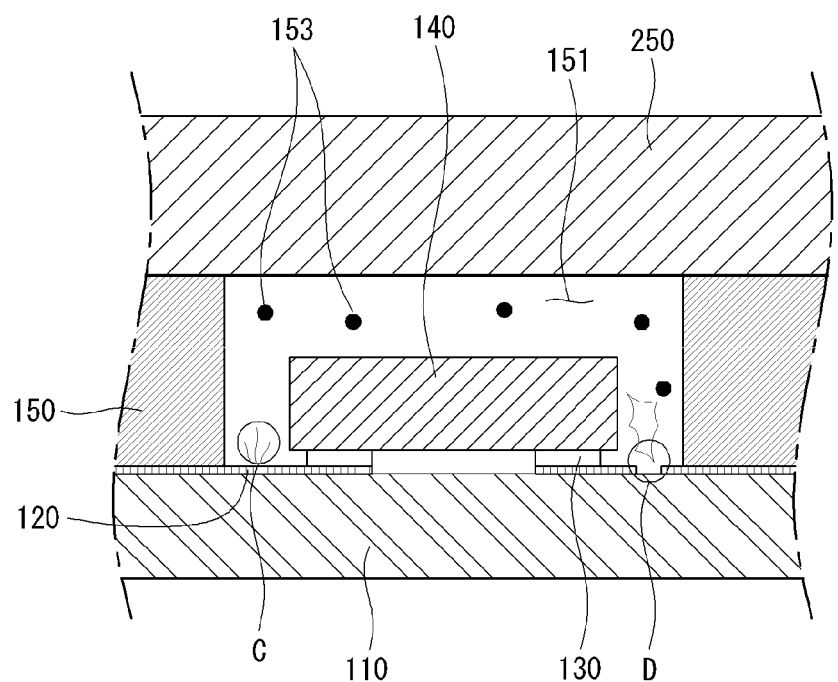

Referring to FIGS. 10 and 11, a resin layer 150 may be attached to an attached surface 250. A pollutant 153 present in the air may be positioned in a hole 151. The pollutant 153 may be separated from the attached surface 250 and placed in the holes 151. The pollutant 153 may be small sized particles such as dust.

The pollutant 153 may be adsorbed to an electrode layer 120, a metal pad 130, or a light source 140. When power is applied to the electrode layer 120, the pollutant 153 may react with the electrode layer 120, the metal pad 130, or the light source 140. Due to the pollutant 153, a region C where the electrode layer 120, the metal pad 130, or the light source 140 is heated may be generated. Also, a region D where the electrode layer 120, the metal pad 130, or the light source 140 is heated to break may be generated.

As a result, the electrode layer 120 or the metal pad 130 can be damaged. If the electrode layer 120 or the metal pad 130 is damaged, power supply to the light source 140 may not be smooth. Therefore, in order to improve quality of the display device, it is preferable that the electrode layer 120 or the metal pad 130 is not exposed to the air.

Figure 12:
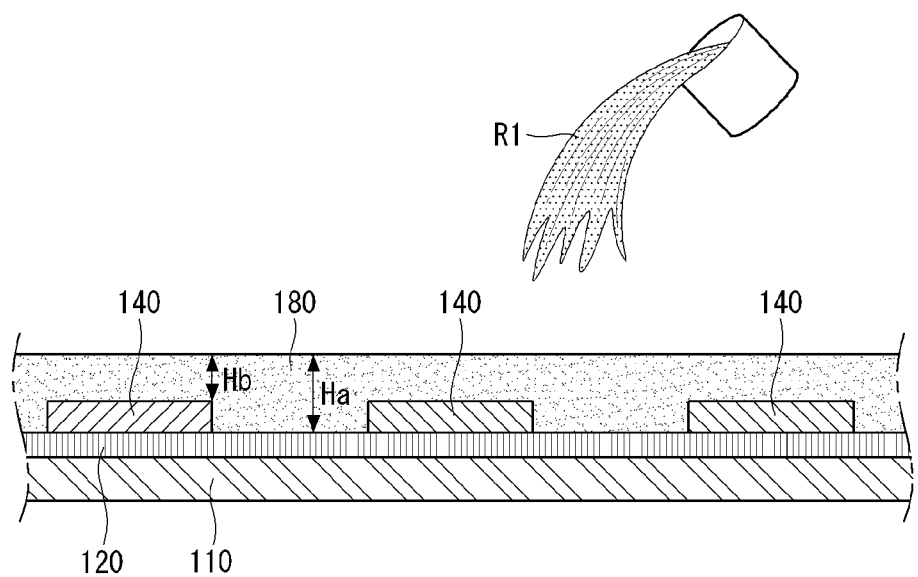
Figure 13:
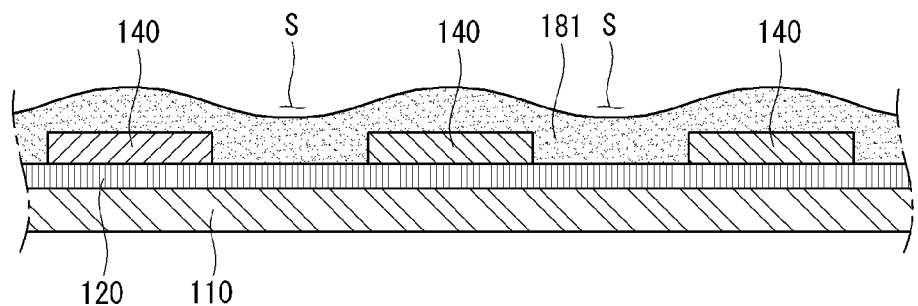
Figure 14:
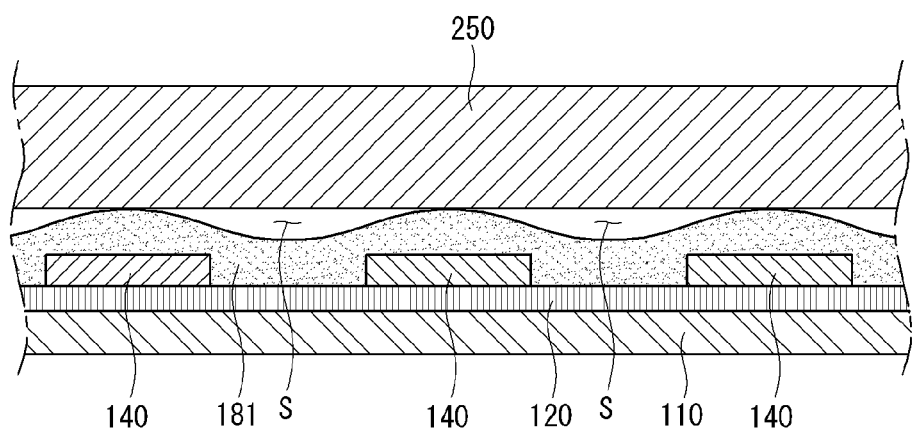

Referring to FIGS. 12 to 14, a resin layer 180 may be formed by pouring a liquid resin R1 into a base 110. The liquid resin R1 may coat an electrode layer 120 and a light source 140. The electrode layer 120 and the light source 140 may be immersed in the liquid resin R1. The liquid resin R1 may be a thermosetting resin. A height of the liquid resin R1 where the light source 140 is positioned may be different from a height of the liquid resin R1 where the light source 140 is not positioned. The height Ha of the liquid resin R1 where the light source 140 is not positioned may be greater than the height Hb of the liquid resin R1 where the light source 140 is positioned.

The liquid resin R1 may change into a solid through a heat curing process. A surface of the resin layer 180 may be flat before it undergoes the heat curing process. The liquid resin R1 may shrink as it undergoes the heat curing process. After the heat curing process, the surface of the resin layer 181 may not be flat. The surface of the resin layer 181 may be curved. A curvature of the resin layer can form a space S. When the resin layer 181 is attached to an attached surface 250, a contact area can be reduced due to the space S. When the electrode layer 120 and the light source 140 are coated with the liquid resin R1, a bond between the resin layer 181 and the attached surface 250 may be weakened.

Figure 15:
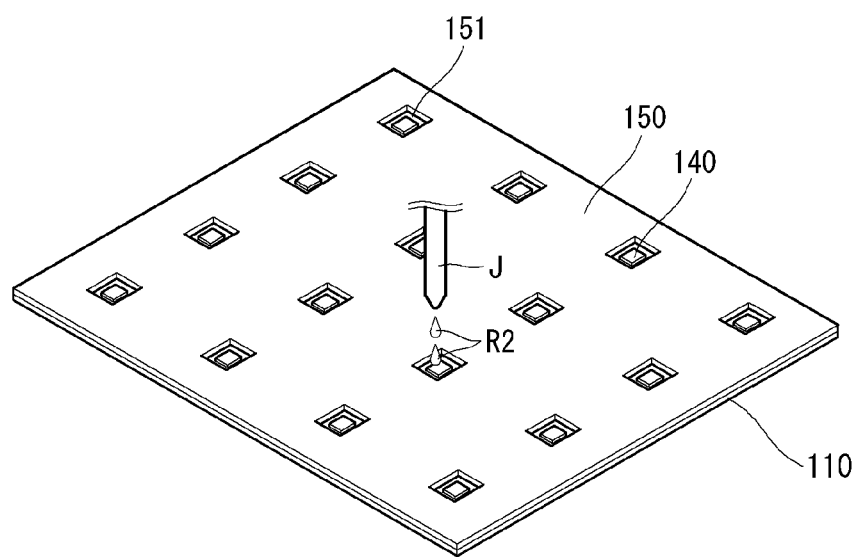

Referring to FIG. 15, a liquid resin R2 may be filled in a hole 151. The liquid resin R2 may be filled in the hole 151 through an injection device J. The liquid resin R2 may cover an electrode layer, a metal pad, or a light source 140 exposed to the air. The liquid resin R2 can prevent a pollutant from being adsorbed on the electrode layer, the metal pad, or the light source 140. The liquid resin R2 may include silicon.

The liquid resin R2 may be cured through a heat curing process after filling. The liquid resin R2 may be a solid resin after curing. The solid resin can be called a resin.

Depending on a filling amount of the resin, optical characteristics of the display device can be changed. The filling amount of the resin and the optical characteristics of the display device are as follows.

TABLE 1

| | Process conditions | | | Optical characteristics | | | |
|---|---|---|---|---|---|---|---|
| Pressure [kg/cm²] | Time [sec] | Filling amount [mg] | Filling volume [%] | Luminance [nit] | Wx | Wy | Remarks |
| Ref. | — | — | | 1,287 | 0.274 | 0.266 | |
| 2 | 0.5 | 0.3 | 11% | 1,217 | 0.257 | 0.233 | filling deviation is large Unfilling |
| | 1 | 0.6 | 21% | 1,225 | 0.258 | 0.238 | filling deviation is large |
| | 2 | 1.2 | 43% | 1,252 | 0.262 | 0.246 | |
| | 3 | 1.9 | 68% | 1,180 | 0.262 | 0.245 | |
| 4 | 0.5 | 0.6 | 21% | 1,197 | 0.261 | 0.237 | filling deviation is large |
| | 1 | 1.2 | 43% | 1,225 | 0.265 | 0.249 | |
| | 2 | 2.5 | 89% | 1,071 | 0.257 | 0.239 | Reduced luminance |
| | 3 | 3.7 | 132% | 832 | 0.242 | 0.211 | Reduced luminance Overfilling |
| 6 | 0.5 | 0.9 | 32% | 1,254 | 0.261 | 0.249 | filling deviation is large |
| | 1 | 1.9 | 68% | 1,172 | 0.259 | 0.247 | |
| | 2 | 3.7 | 132% | 845 | 0.242 | 0.212 | Reduced luminance Overfilling |
| | 3 | 5.6 | 200% | 848 | 0.244 | 0.208 | Reduced luminance Overfilling |
| 7 | 0.5 | 1 | 36% | 1,233 | 0.261 | 0.245 | filling deviation is large |
| | 1 | 2 | 71% | 1,111 | 0.258 | 0.236 | Reduced luminance |
| | 2 | 4.1 | 146% | 845 | 0.243 | 0.208 | Reduced luminance Overfilling |
| | 3 | 6.1 | 218% | 805 | 0.241 | 0.204 | Reduced luminance Overfilling |

Table 1 shows experiments in which optical characteristics were measured depending on the filling amount of the resin filled in the holes and the process conditions. The pressure may be discharge pressure of the injection device. The time may mean time for the injection device to discharge the resin. The filling amount may be mass of the resin injected into the hole by the injection device.

The filling volume may be a ratio of a volume occupied by the resin to a difference between a volume of the hole and a volume of the light source. For example, the volume of the hole may be 2.8*2.0*0.588≈3.29 mm³. The volume of the light source may be 1.6*0.8*0.4≈0.51 mm³.

When the filling volume exceeds 100%, it can be referred to as overfilling.

When the filled resin cannot cover all of the electrode layer, the metal pad, and the light source, it can be referred to as unfilling.

Even if the injection device is operated at the same pressure and time, the filling volume can be changed. This can be referred to as a filling deviation.

When filling is repeated at the same pressure and time using the injection device, and overfilling occurs or unfilling occurs, it can be said that the filling deviation is large.

The luminance may mean luminance of the display device after the resin is filled. Wx and Wy may denote the color coordinates of the display device.

Figure 16:
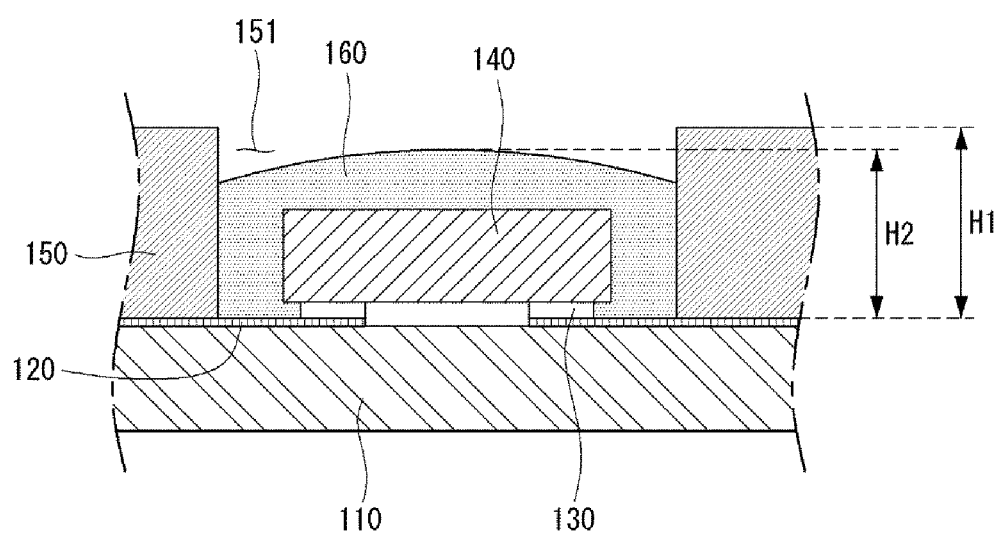

Referring to FIG. 16 and Table 1, the filling volume may preferably be 20 to 70%. A resin 160 may cover all of an electrode layer 120, a metal pad 130, and a light source 140. A height H1 of a resin layer 150 from the electrode layer 120 may be greater than a height H2 of the resin 160 from the electrode layer 120.

When the filling volume is 20 to 70%, luminance, Wx and Wy can be reduced.

Due to the filling deviation, the filling volume may drop to less than 20%. Due to the filling deviation, the filling volume may exceed 70%.

Considering the filling deviation, a preferable filling volume may be 40 to 60%.

Figure 17:
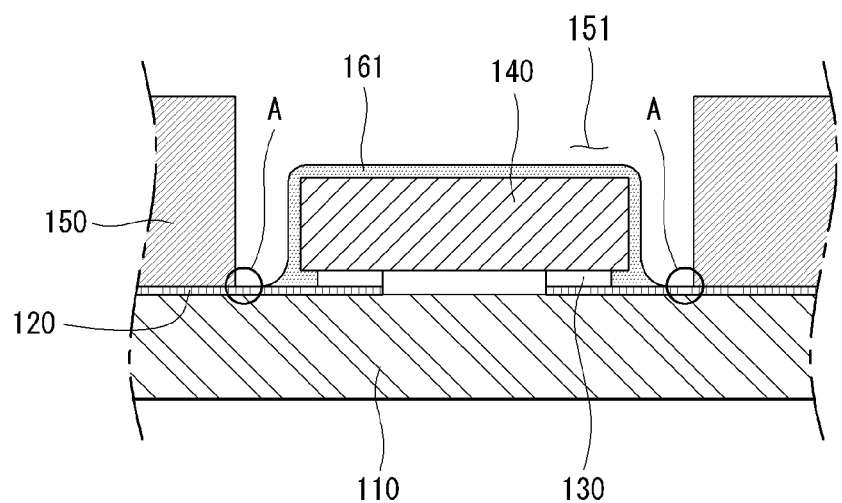

Referring to FIG. 17 and Table 1, when the filling volume is less than 20%, unfilling may occur. A resin 161 may cover a part of an electrode layer 120, a metal pad 130, or a light source 140. A region A where a part of the electrode layer 120, the metal pad 130, or the light source 140 is exposed to the outside may be generated.

Figure 18:
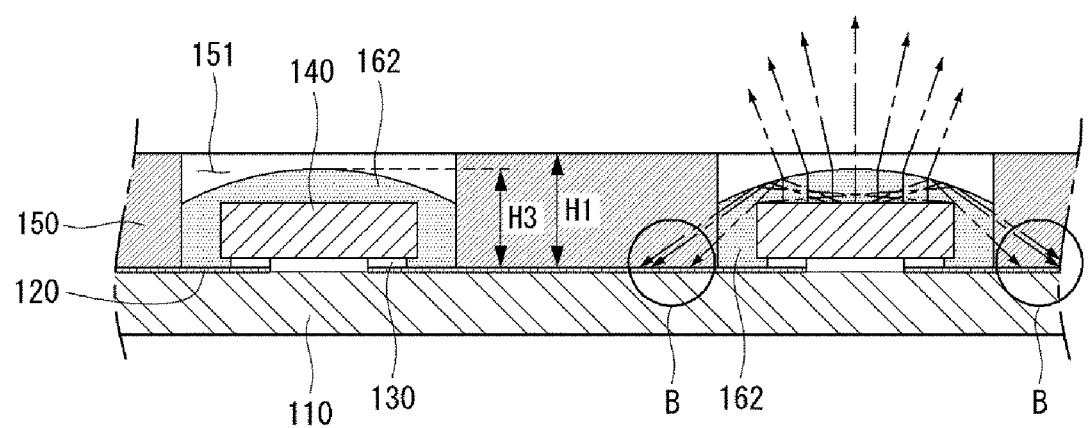

Referring to FIG. 18 and Table 1, when the filling volume is 70 to 100%, the luminance can be reduced. A resin 162 may cover all of an electrode layer 120, a metal pad 130, and a light source 140. A height H1 of a resin layer 150 from the electrode layer 120 may be greater than a height H3 of the resin 162 from the electrode layer 120.

Light emitted from the light source 140 may be totally reflected at a boundary surface between the resin 162 and the outside. The total reflected light B may not be emitted to the front of the display device. The total reflected light B may be emitted to the rear of the display device. The luminance of the display device may be reduced due to the total reflected light B.

Figure 19:
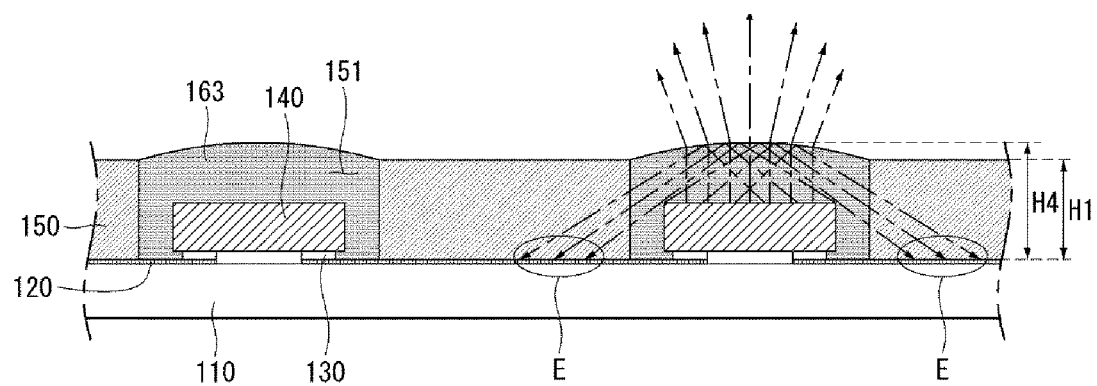

Referring to FIG. 19 and Table 1, the filling volume may exceed 100%. A height H4 of a resin 163 from an electrode layer 120 may be greater than a height H1 of a resin layer 150 from the electrode layer 120.

Light emitted from a light source 140 may be totally reflected at a boundary surface between the resin 163 and the outside. The total reflected light E may not be emitted to the front of the display device. The total reflected light E may be emitted to the rear of the display device. The luminance of the display device may be reduced due to the total reflected light E.

A surface of the resin layer 150 may be curved due to the overfilled resin 163. When the resin layer 150 is attached to an attached surface, a contact area may be reduced due to the curve. If the contact area is reduced, bond between the resin layer 150 and the attached surface may be weakened.

Figure 20:
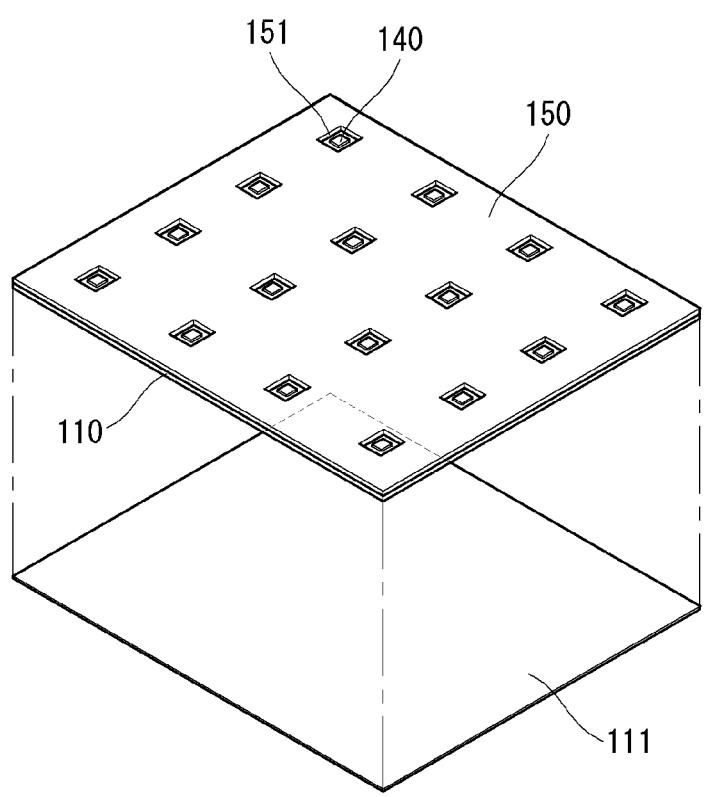
Figure 21:
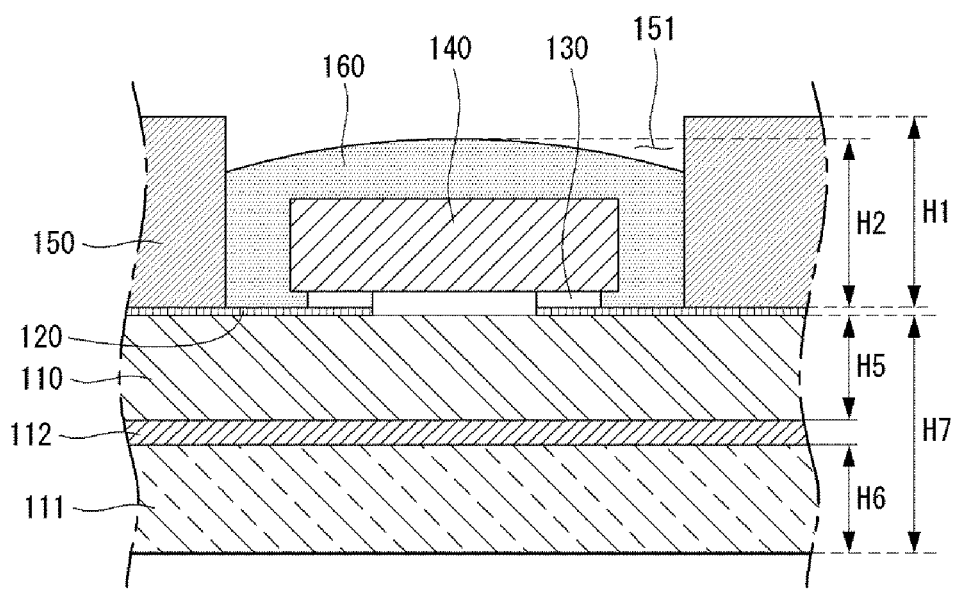

Referring to FIGS. 20 and 21, a second base 111 may be attached to a rear surface of a first base 110. An adhesive layer 112 may be formed on the rear surface of the first base 110. A height H5 of the first base 110 may be the same as a height H6 of the second base 111. The height H6 of the second base 111 may be 1 to 1.5 times the height H5 of the first base 110.

A sum H7 of the heights of the first base 110, the adhesive layer 112 and the second base 111 may be the same as a height H1 of a resin layer 150. The sum H7 of the heights of the first base 110, the adhesive layer 112 and the second base 111 may be greater than the height H1 of the resin layer 150. The sum H7 of the heights of the first base 110, the adhesive layer 112 and the second base 111 may be 1 to 1.5 times the height H1 of the resin layer 150.

The second base 111 may be combined with the first base 110 to increase a thickness of the display device. The display device can protect an electrode layer 120, a metal pad 130, or a light source 140 from an external impact by increasing the thickness.

Figure 22:
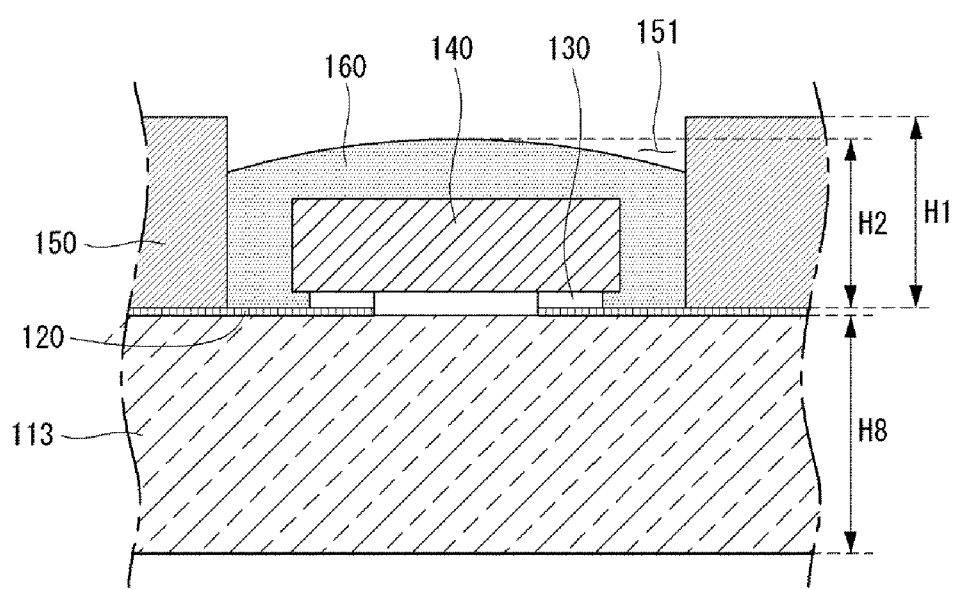

Referring to FIG. 22, a height H8 of a base 113 may be the same as a height H1 of a resin layer 150. The height H8 of the base 113 may be greater than the height H1 of the resin layer 150. The height H8 of the base 113 may be 1 to 1.5 times the height H1 of the resin layer 150.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
    a substrate;
    an electrode layer provided on a front surface of the substrate and including a positive electrode extended along a first row and a plurality of negative electrodes each extended along respective additional rows positioned below the first row;
    a plurality of light sources provided on the front surface in a second row and electrically connected to the electrode layer such that the positive electrode in the first row is connected to the plurality of light sources in the second row and the plurality of negative electrodes are each connected to a respective light source from among the plurality of light sources in the second row;
    a resin layer provided on the front surface and comprising a plurality of through holes, wherein a light source among the plurality of light sources is positioned in a corresponding through hole and at least a part of the electrode layer is exposed via the corresponding through hole; and
    a resin portion provided as a single curved shape in each of the plurality of through holes and configured to cover an exposed part of the electrode layer and a corresponding light source,
    wherein a first volume of the resin portion is in a range between 30% to 70% of a second volume corresponding to a difference between a volume defined within the corresponding through hole and a volume of the corresponding light source, wherein a height of the resin layer is greater than a height of the resin portion.

2. The display device of claim 1, wherein the first volume of the resin portion is in a range between 40% to 60% of the second volume.

3. The display device of claim 1, wherein the resin portion is made of a material which has a thermosetting property.

4. The display device of claim 1, wherein the resin portion comprises silicon.

5. The display device of claim 1, wherein the resin portion is configured to allow light to pass therethrough.

6. The display device of claim 1, further comprising:
a metal pad positioned between the electrode layer and the plurality of light sources,
wherein the height of the resin portion from the substrate is greater than a height of the metal pad from the substrate.

7. The display device of claim 6, wherein the resin portion covers the metal pad.

8. The display device of claim 1, wherein the height of the resin portion from the substrate is greater than a height of the corresponding light source among the plurality of light sources from the substrate.

9. The display device of claim 1, wherein the resin portion covers the plurality of light sources.

10. The display device of claim 1, further comprising a second substrate coupled to a rear surface of the substrate via an adhesive layer.

11. The display device of claim 10, wherein the second substrate is configured to allow light to pass therethrough.

12. The display device of claim 10, wherein a thickness formed by the substrate, the adhesive layer, and the second substrate is greater than a thickness of the resin layer.

13. The display device of claim 10, wherein the second substrate comprises a polyethylene terephthalate (PET) material.

14. The display device of claim 1, wherein a thickness of the substrate is greater than a thickness of the resin layer.

15. The display device of claim 1, wherein the resin portion does not pass above a plane corresponding to a top surface of the resin layer.

* * * * *